US012696391B2

(12) United States Patent
Nishiyama et al.

(10) Patent No.: US 12,696,391 B2
(45) Date of Patent: Jul. 28, 2026

(54) WIRING BOARD

(71) Applicant: SHINKO ELECTRIC INDUSTRIES CO., LTD., Nagano (JP)

(72) Inventors: Takashi Nishiyama, Nagano (JP); Tomoo Yamasaki, Nagano (JP); Noriyoshi Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 281 days.

(21) Appl. No.: 18/734,386

(22) Filed: Jun. 5, 2024

(65) Prior Publication Data

US 2024/0413064 A1 Dec. 12, 2024

(30) Foreign Application Priority Data

Jun. 8, 2023 (JP) ................................. 2023-094602

(51) Int. Cl.
*H05K 1/11* (2006.01)
(52) U.S. Cl.
CPC .................................... *H05K 1/115* (2013.01)
(58) Field of Classification Search
CPC ... H05K 1/115; H10W 70/685; H10W 90/701
USPC ................................................. 174/261, 262
See application file for complete search history.

(56) References Cited

U.S. PATENT DOCUMENTS

2018/0279472 A1* 9/2018 Sunohara ............... H05K 1/115
2019/0333849 A1 10/2019 Furuichi

FOREIGN PATENT DOCUMENTS

JP 2019-192885 10/2019

* cited by examiner

*Primary Examiner* — Kiet T Nguyen
(74) *Attorney, Agent, or Firm* — IPUSA, PLLC

(57) ABSTRACT

A wiring board includes a first insulating layer provided on an interconnect layer, a second insulating layer provided on the first insulating layer, a first opening formed in the first insulating layer and reaching the interconnect layer, a second opening formed in the second insulating layer and having a lower end connected to an upper end of the first opening, a third opening formed in the second insulating layer and having a lower end connected to an upper end of the second opening, and a connection terminal formed inside the first, second, and the third openings, and making contact with an upper surface of the interconnect layer. The lower end diameter of the second opening is equal to the upper end diameter of the first opening, and the lower end diameter of the third opening is larger than the upper end diameter of the second opening.

7 Claims, 6 Drawing Sheets

WIRING BOARD

CROSS-REFERENCE TO RELATED APPLICATIONS

This application is based upon and claims priority to Japanese Patent Application No. 2023-094602, filed on Jun. 8, 2023, the entire contents of which are incorporated herein by reference.

FIELD

Certain aspects of the embodiments discussed herein are related to wiring boards, and methods for manufacturing wiring boards.

BACKGROUND

A wiring board has connection terminals to which a semiconductor element or the like is connected. When forming the connection terminals, an insulating layer covering an interconnect layer is formed, openings are formed in the insulating layer, the connection terminals are formed in the openings using a growth mask, a solder resist layer covering the insulating layer and the connection terminals is formed, openings are formed in the solder resist layer, and the connection terminals are surface-treated by electroless plating.

Related art includes Japanese Laid-Open Patent Publication No. 2019-192885, for example.

In the conventional wiring board, a misalignment may occur in the growth mask used for forming the connection terminals, or a misalignment may occur in the openings of the solder resist layer. For this reason, as the miniaturization of the wiring board progresses, a connection reliability may deteriorate due to the misalignment. For example, a conduction failure may occur or a short circuit may occur between adjacent connection terminals.

SUMMARY

One aspect of the present disclosure provides a wiring board and a method for manufacturing the wiring board that can reduce deterioration of the connection reliability.

According to one aspect of the present disclosure, a wiring board includes an interconnect layer; a first insulating layer provided on the interconnect layer; a second insulating layer provided on the first insulating layer; a first opening formed in the first insulating layer and reaching the interconnect layer; a second opening formed in the second insulating layer, the second opening having a lower end thereof connected to an upper end of the first opening; a third opening formed in the second insulating layer, the third opening having a lower end thereof connected to an upper end of the second opening; and a connection terminal formed inside the first opening, the second opening, and the third opening, and making contact with an upper surface of the interconnect layer, wherein a diameter of the lower end of the second opening is equal to a diameter of the upper end of the first opening, and a diameter of the lower end of the third opening is larger than a diameter of the upper end of the second opening.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
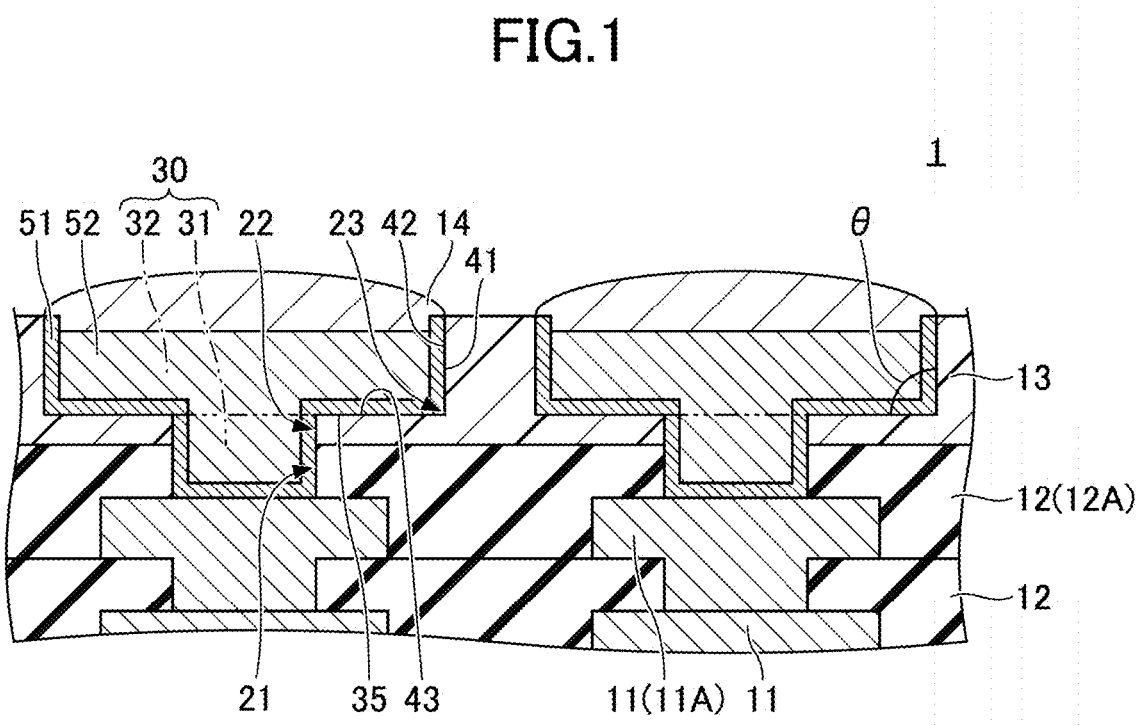
FIG. 1 is a cross sectional view illustrating a wiring board according to a first embodiment.

Hereinafter, embodiments will be described in detail with reference to the accompanying drawings. In the specification and the drawings, constituent elements having substantially the same functional configuration are designated by the same reference numerals, and a redundant description thereof may be omitted.

First Embodiment

First, a first embodiment will be described. The first embodiment relates to a wiring board.

[Structure of Wiring Board]

A structure of the wiring board according to the first embodiment will be described. FIG. 1 is a cross sectional view illustrating the wiring board according to the first embodiment.

As illustrated in FIG. 1, the wiring board 1 according to the first embodiment includes an interconnect layer 11, an insulating layer 12, a solder resist layer 13, connection terminals 30, and solder bumps 14, for example. In the present disclosure, for the sake of convenience, the side of the wiring board 1 provided with the solder resist layer 13, with reference to the interconnect layer 11, is referred to as an upper side or one side, and the opposite side of the wiring board 1 is referred to as a lower side or the other side. In addition, an upper surface of each portion of the wiring board 1 is referred to as one surface or an upper surface, and a lower surface of each portion of the wiring board 1 is referred to as the other surface or a lower surface. However, the wiring board 1 can be used in an upside-down state or can be arranged at an arbitrary angle. FIG. 1 illustrates a vicinity of the one surface (upper surface) of the wiring board 1. Further, a plan view of an object refers to a view of the object viewed from above in a normal direction to the one surface of the solder resist layer 13.

The wiring board 1 includes a plurality of interconnect layers 11, and a plurality of insulating layers 12. The interconnect layer 11 is provided between two insulating layers 12 adjacent to each other in a thickness direction. The interconnect layers 11 adjacent to each other in the thickness direction are electrically connected to each other through a conductive via inside a via hole formed in the insulating layer 12 between the adjacent interconnect layers 11. A material used for the interconnect layer 11 is copper (Cu) or the like, for example. A material used for the insulating layer 12 is an insulating resin or the like including an epoxy-based resin or a polyimide-based resin as a main component thereof, for example. The insulating layer 12 may include a filler, such as silica ($SiO_2$) or the like. The wiring board 1 may include a core layer including glass epoxy or the like.

In an uppermost pair of the interconnect layer 11 and the insulating layer 12 (hereinafter also referred to as an interconnect layer 11A and an insulating layer 12A, respectively), the insulating layer 12A is provided on the interconnect layer 11A, and covers the interconnect layer 11A. The solder resist layer 13 is provided on the insulating layer 12A, and covers the insulating layer 12A. The insulating layer 12A is an example of a first insulating layer, and the solder resist layer 13 is an example of a second insulating layer.

A first opening 21 is formed in the insulating layer 12A, and reaches the interconnect layer 11A. An upper end of the first opening 21 is located on an upper surface of the insulating layer 12A. A second opening 22 and a third opening 23 are formed in the solder resist layer 13. The second opening 22 is formed below the third opening 23, a lower end of the second opening 22 is located on a lower surface of the solder resist layer 13, and an upper end of the third opening 23 is located on an upper surface of the solder resist layer 13. A plurality of sets of the first opening 21, the second opening 22, and the third opening 23 are formed.

In addition, the lower end of the second opening 22 is connected to the upper end of the first opening 21, and the lower end of the third opening 23 is connected to the upper end of the second opening 22. A diameter of the lower end of the second opening 22 is equal to a diameter of the upper end of the first opening 21, and a diameter of the lower end of the third opening 23 is larger than a diameter of the upper end of the second opening 22. An inner wall surface of the first opening 21 and an inner wall surface of the second opening 22 are connected to each other over the entire circumference. Moreover, the inner wall surface of the second opening 22 and a bottom surface 43 of the third opening 23 are connected over the entire circumference, and in the plan view, the inner wall surface of the second opening 22 is located on an inner side of an inner wall surface 42 of the third opening 23 over the entire circumference.

An angle θ formed by a bottom surface 43 of the third opening 23 and the inner wall surface 42 of the third opening 23 is in a range greater than or equal to 850 and less than or equal to 95°, preferably in a range greater than or equal to 87° and less than or equal to 92°, and more preferably in a range greater than or equal to 89° and less than or equal to 91°, for example.

The connection terminal 30 is formed inside the first opening 21, the second opening 22, and the third opening 23. In other words, the connection terminal 30 is formed for each set of the first opening 21, the second opening 22, and the third opening 23. The connection terminal 30 includes a via region 31, and a pad region 32. The via region 31 is located inside the first opening 21 and the second opening 22, and the pad region 32 is located inside the third opening 23. The via region 31 and the pad region 32 are integrally formed. A diameter of a lower end of the pad region 32 is larger than a diameter of an upper end of the via region 31. A side surface 41 of the pad region 32 makes contact with the inner wall surface 42 of the third opening 23. The pad region 32 has a surface 35 which makes contact with the bottom surface 43 of the third opening 23. The solder resist layer 13 does not make contact with an upper surface of the pad region 32, and the entire upper surface of the pad region 32 is exposed via the third opening 23. In a case where the angle θ is greater than or equal to 90°, the upper surface of the pad region 32 is not covered with the solder resist layer 13.

The connection terminal 30 includes a first layer 51, and a second layer 52. The first layer 51 makes contact with the solder resist layer 13, the insulating layer 12A, and the interconnect layer 11A. The second layer 52 is provided inside the first layer 51. An electrical resistivity of a material forming the second layer 52 is lower than an electrical resistivity of a material forming the first layer 51. In addition, an adhesion between the material forming the first layer 51 and the solder resist layer 13 is higher than an adhesion between the material forming the second layer 52 and the solder resist layer 13. The first layer 51 functions as an adhesion layer. For example, the first layer 51 includes titanium (Ti), and the second layer 52 includes copper (Cu). The first layer 51 may be a titanium layer or a copper nickel titanium (Cu—Ni—Ti) alloy layer, and the second layer 52 may be a copper (Cu) layer. The second layer 52 may have a thickness greater than a thickness of the first layer 51.

For example, an upper end surface of the first layer 51 may coincide with the upper surface of the solder resist layer 13, and an upper surface of the second layer 52 may be located below the upper surface of the solder resist layer 13.

The solder bump 14 is provided on the connection terminal 30. Examples of a material used for the solder bump 14 include lead-free solders, such as a tin silver (SnAg) based alloy, a tin zinc (SnZn) based alloy, a tin copper (SnCu) based alloy, or the like, and leaded solders, such as a lead tin (PbSn) based alloy. The solder bump 14 makes contact with an upper surface of the connection terminal 30. A portion of the solder bump 14 may make contact with the upper surface of the solder resist layer 13.

[Method for Manufacturing Wiring Board]

Next, a method for manufacturing the wiring board according to the first embodiment will be described. FIG. 2A through FIG. 4B are cross sectional views illustrating the method for manufacturing the wiring board according to the first embodiment.

Figure 2A:
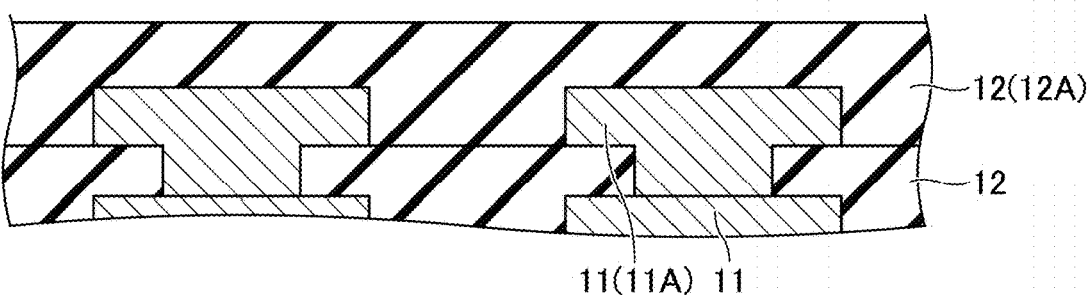
FIG. 2A, FIG. 2B, and FIG. 2C are cross sectional views (part 1) illustrating a method for manufacturing the wiring board according to the first embodiment.

First, as illustrated in FIG. 2A, a laminated body including a plurality of insulating layers 12 and a plurality of interconnect layers 11 is formed. The laminated body can be formed by a build-up method, for example. The interconnect layer 11 may be formed by a semi-additive method or a subtractive method, for example.

Figure 2B:
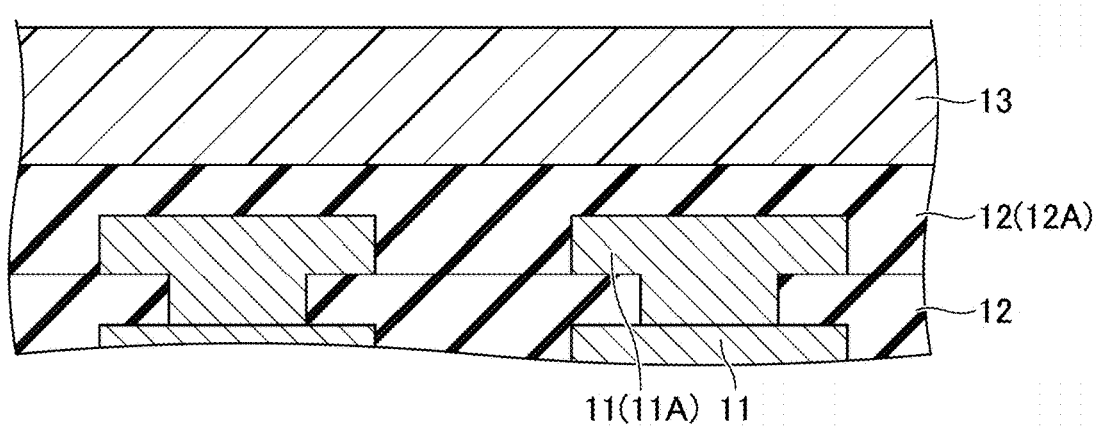

Next, as illustrated in FIG. 2B, the solder resist layer 13 is formed on the uppermost insulating layer 12A among the plurality of insulating layers 12.

Figure 2C:
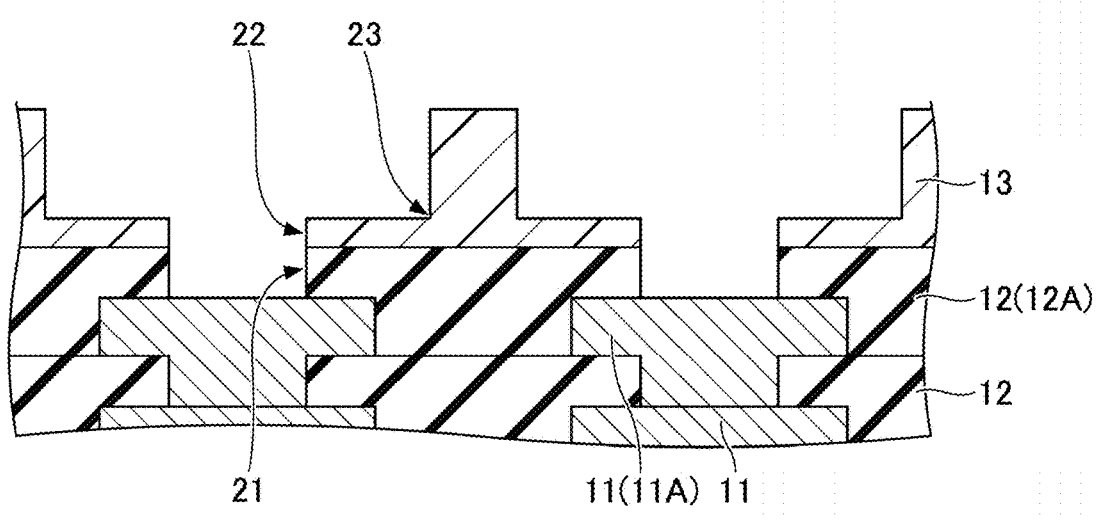

Thereafter, as illustrated in FIG. 2C, the second opening 22 and the third opening 23 are formed in the solder resist layer 13, and the first opening 21 is formed in the insulating layer 12A. The second opening 22 is formed so that the diameter of the lower end thereof is equal to the diameter of the upper end of the first opening 21, and the third opening 23 is formed so that the diameter of the lower end thereof is larger than the diameter of the upper end of the second opening 22. The first opening 21, the second opening 22, and the third opening 23 can be formed by irradiating laser light, such as excimer laser light or the like. In third opening 23 formed by irradiating the laser light, the angle θ formed by the bottom surface 43 and the inner wall surface 42 likely falls within a range greater than or equal to 85° and less than or equal to 95°. After the first opening 21, the second opening 22, and the third opening 23 are formed, a plasma treatment may be performed as a descum treatment. When the plasma treatment is performed, the angle θ becomes even closer to 90°.

Figure 5:
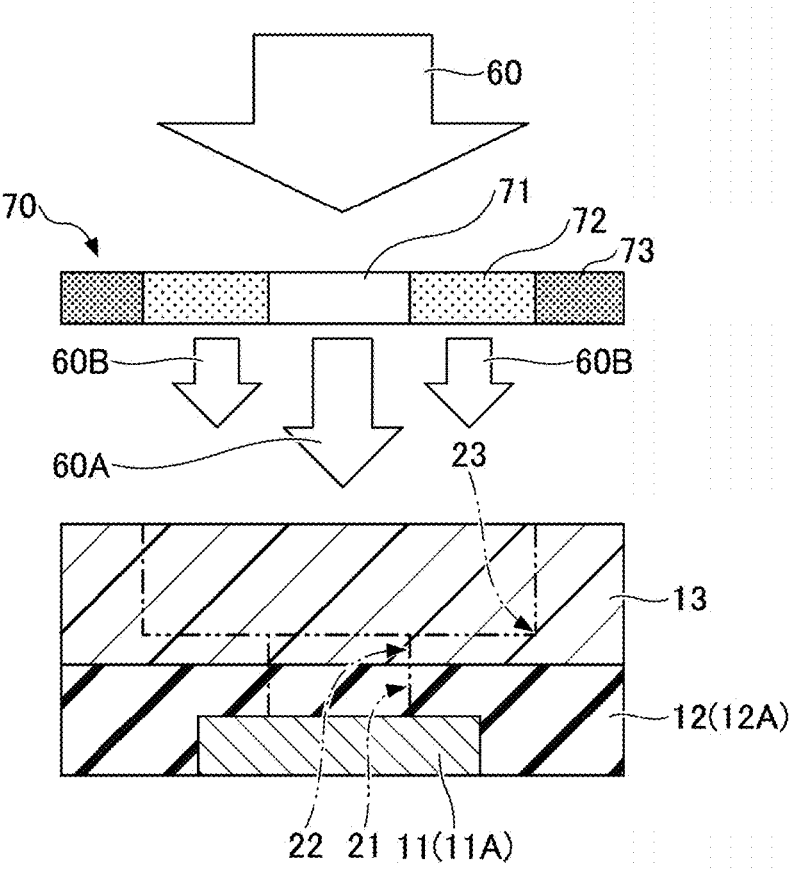
FIG. 5 is a schematic diagram illustrating an example of a laser light irradiation method.

For example, as illustrated in FIG. 5, the first opening 21, the second opening 22, and the third opening 23 can be formed simultaneously by using a mask 70 that weakens an intensity of laser light 60, so that an intensity of laser light 60B irradiating a region where the third opening 23 is formed becomes lower than an intensity of laser light 60A irradiating regions where the first opening 21 and the second opening 22 are formed. The mask 70 includes a first light transmitting portion 71, a second light transmitting portion 72, and a light shielding portion 73. The intensity of the laser light passing through the second light transmitting portion 72 becomes lower than the intensity of the laser light passing through the first light transmitting portion 71. Alternatively, the third opening 23 and the first and second openings 21 and 22 may be formed separately without using the mask 70, by irradiating laser light two times with different intensities.

Figure 3A:
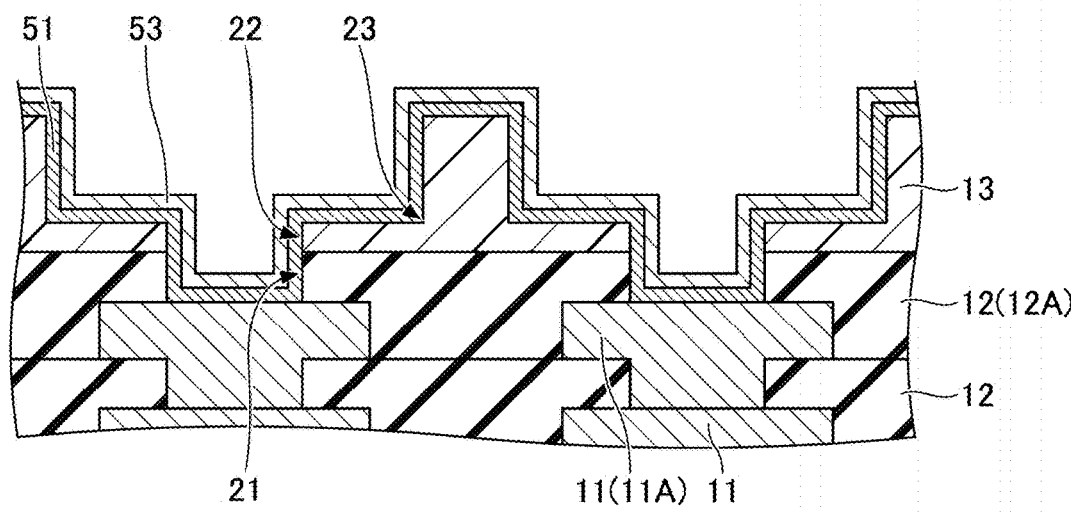
FIG. 3A, FIG. 3B, and FIG. 3C are cross sectional views (part 2) illustrating the method for manufacturing the wiring board according to the first embodiment.

Next, as illustrated in FIG. 3A, a first layer 51 is formed on the interconnect layer 11A, the insulating layer 12A, and the solder resist layer 13 by sputtering, and a plating seed layer 53 is formed on the first layer 51. For example, the first layer 51 is a titanium layer, and the plating seed layer 53 is a copper layer. For example, a thicknesses of the first layer 51 is in a range of 10 nm to 100 nm, and a thicknesses of the plating seed layer 53 is in a range of 100 nm to 500 nm.

Figure 3B:
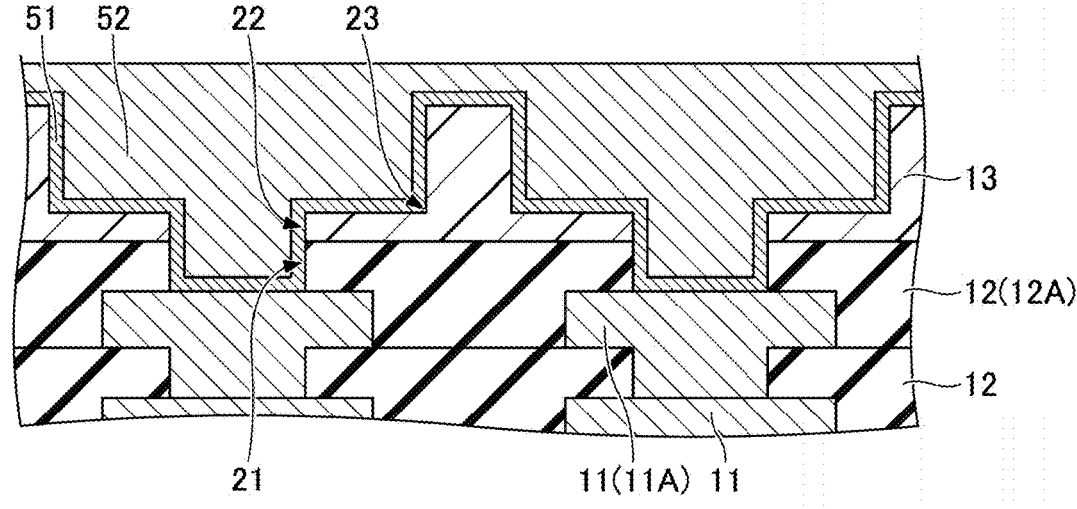

Next, as illustrated in FIG. 3B, a plating layer is formed by electrolytic plating using the plating seed layer 53 as a power feeding path, thereby forming the second layer 52 including the plating seed layer 53. In this case, the second layer 52 is formed so that the upper surface of the second layer 52 is located at a position higher than the upper surface of the solder resist layer 13.

Figure 3C:
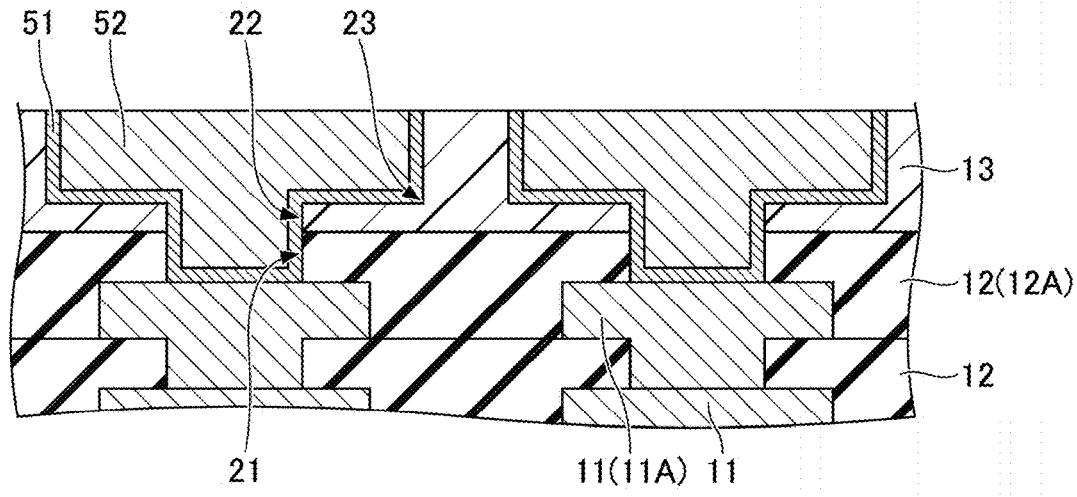

Thereafter, as illustrated in FIG. 3C, chemical mechanical polishing (CMP) is performed on the second layer 52, the first layer 51, and the solder resist layer 13, so that the upper surface of the second layer 52, the upper end surface of the first layer 51, and the upper surface of the solder resist layer 13 coincide with one another.

Figure 4A:
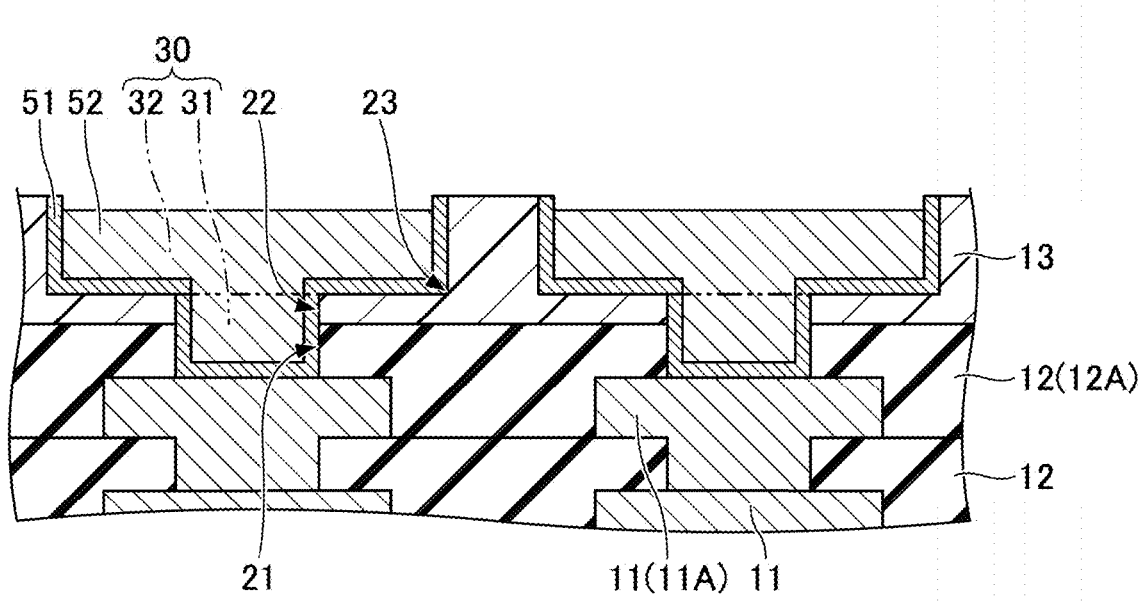
FIG. 4A and FIG. 4B are cross sectional views (part 3) illustrating the method for manufacturing the wiring board according to the first embodiment.

Next, as illustrated in FIG. 4A, a surface layer portion of the second layer 52 is etched, so that the upper surface of the second layer 52 is located at a position below the upper surface of the solder resist layer 13. The connection terminal 30 having the first layer 51 and the second layer 52 is formed in this manner. After the etching the surface layer portion of the second layer 52, a surface treatment may be performed on the upper surface of the connection terminal 30 by electroless plating.

Figure 4B:
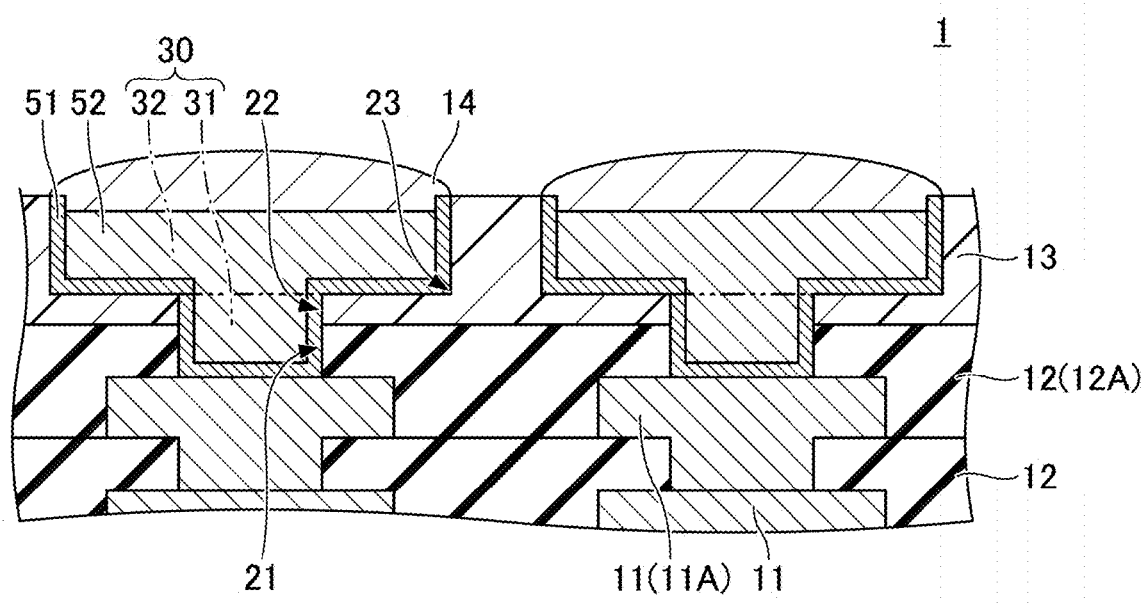

Next, as illustrated in FIG. 4B, the solder bump 14 is formed on the connection terminal 30.

The wiring board 1 according to the first embodiment can be manufactured in the manner described above.

In the wiring board 1, the first opening 21 is formed in the insulating layer 12A, the second opening 22 and the third opening 23 are formed in the solder resist layer 13, and the connection terminals 30 are formed inside the first opening 21, the second opening 22, and the third opening 23. In addition, the diameter of the lower end of the second opening 22 is equal to the diameter of the upper end of the first opening 21, and the diameter of the lower end of the third opening 23 is larger than the diameter of the upper end of the second opening 22. Accordingly, by irradiating the laser light, for example, the first opening 21 and the second opening 22 can be formed and the third opening 23 can be formed while reducing misalignment therebetween, and the connection terminal 30 can be formed while reducing misalignment with respect to the first opening 21, the second opening 22, and the third opening 23. For this reason, it is possible to reduce a conduction failure and a short circuit between the connection terminals 30, and to reduce deterioration of a connection reliability. In the case where the first opening 21, the second opening 22, and the third opening 23 are formed simultaneously, it is particularly easy to reduce the misalignment.

In addition, because the connection terminal 30 includes the first layer 51 that can function as the adhesion layer, even when a surface treatment is performed on the upper surface of the connection terminal 30 by electroless plating after etching the surface layer portion of the second layer 52, a plating solution is unlikely to enter between the side surface 41 of the pad region 32 and the inner wall surface 42 of the third opening 23 during the surface treatment. Further, because the pad region 32 has the surface 35 making contact with the bottom surface 43 of the third opening 23, and a portion of the solder resist layer 13 is present between the pad region 32 and the insulating layer 12A, even if the plating solution were to enter between the side surface 41 and the inner wall surface 42, the plating solution would unlikely reach between the solder resist layer 13 and the insulating layer 12A. Accordingly, it is possible to reduce the short circuiting and haloing caused by entering of the plating solution.

Moreover, because the first layer 51 functions as the adhesion layer, it is possible to reduce peeling or separation the connection terminal 30 from the solder resist layer 13. Furthermore, in the case where the first layer 51 includes titanium and the second layer 52 includes copper, the first layer 51 can function as a barrier layer which reduces migration of copper. Accordingly, it is possible to reduce a short circuit caused by the migration of copper.

Further, because an interface between the pad region 32 and the solder resist layer 13 is separated from the insulating layer 12A, peeling or separation of a bottom portion of the pad region 32 is less likely caused by a difference in amounts of strain between the insulating layer 12A and the solder resist layer 13, and the connection terminal 30 has a high resistance with respect to thermal stress caused the thermal expansion.

Second Embodiment

Next, a second embodiment will be described. The second embodiment differs from the first embodiment mainly in the configuration of the connection terminal.

[Structure of Wiring Board]

Figure 6:
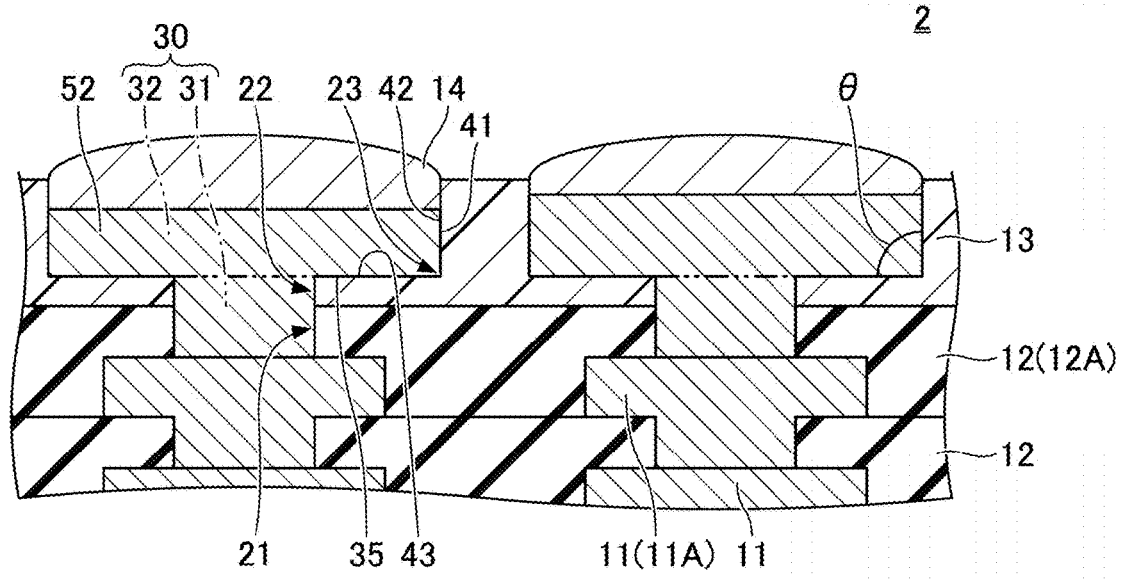
FIG. 6 is a cross sectional view illustrating the wiring board according to a second embodiment.

The structure of the wiring board according to the second embodiment will be described. FIG. 6 is a cross sectional view illustrating the wiring board according to the second embodiment.

As illustrated in FIG. 6, in a wiring board 2 according to the second embodiment, the connection terminal 30 has the via region 31 and the pad region 32 that are similar to those of the first embodiment in terms of the region configuration. On the other hand, in terms of the layer configuration, the connection terminal 30 of the wiring board 2 includes the second layer 52, but does not include the first layer 51. The second layer 52 makes contact with the solder resist layer 13, the insulating layer 12A, and the interconnect layer 11A.

Otherwise, the structure of the second embodiment is the same as the structure of the first embodiment.

7

[Method for Manufacturing Wiring Board]

Figure 7A:
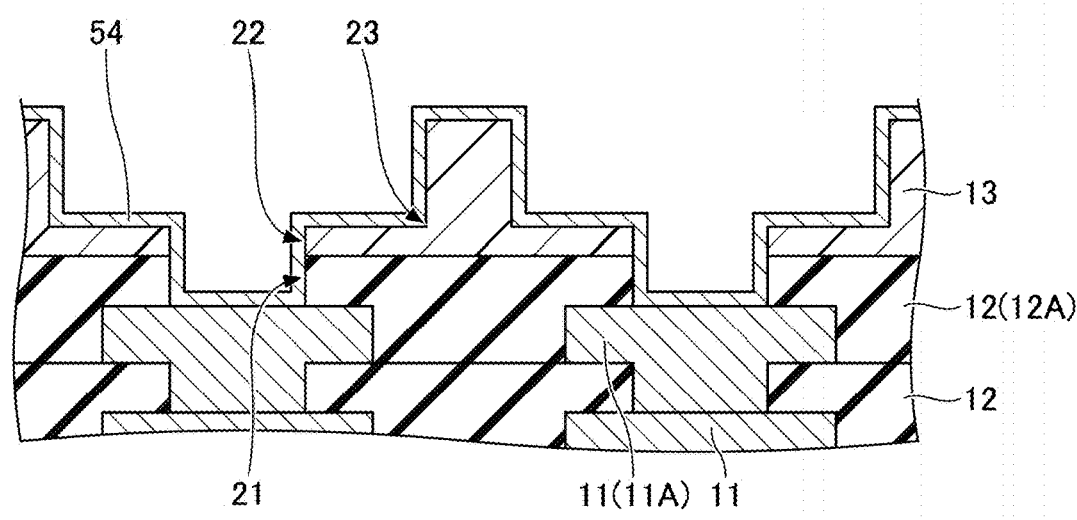
FIG. 7A, FIG. 7B, and FIG. 7C are cross sectional views illustrating the method for manufacturing the wiring board according to the second embodiment.
Figure 7B:
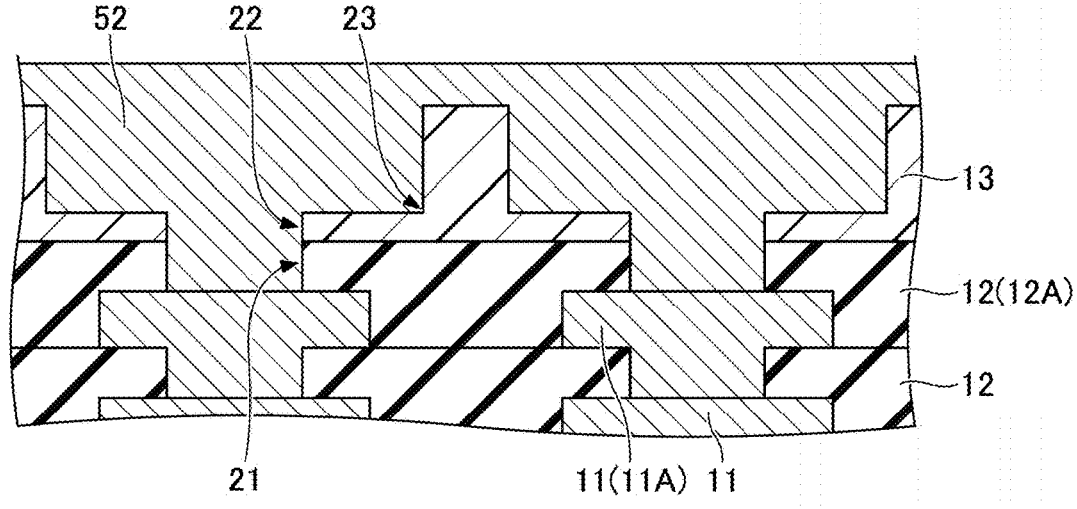
Figure 7C:
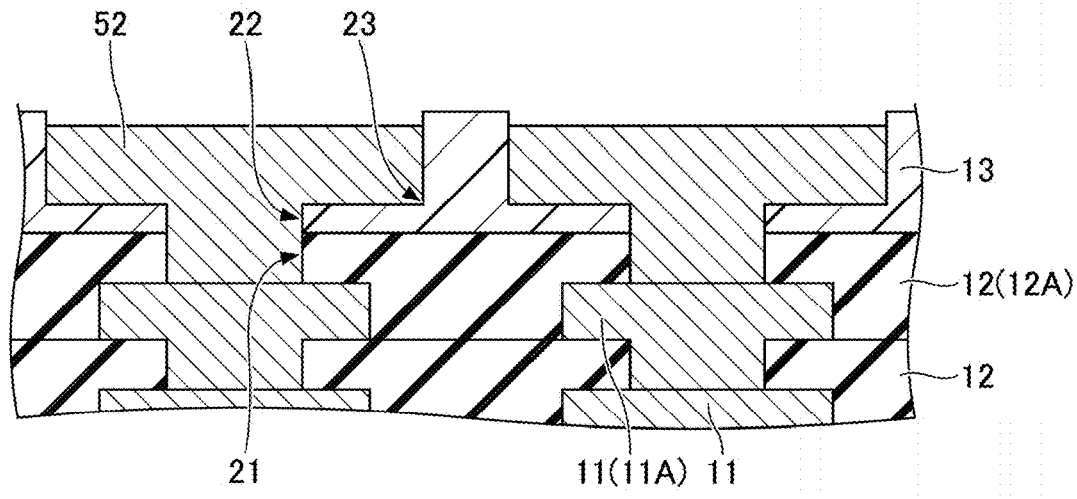

Next, the method for manufacturing the wiring board according to the second embodiment will be described. FIG. 7A through FIG. 7C are cross sectional views illustrating the method for manufacturing the wiring board according to the second embodiment.

First, similar to the first embodiment, the processes up to the formation of the first opening 21, the second opening 22, and the third opening 23 are performed (refer to FIG. 2C). Next, as illustrated in FIG. 7A, a plating seed layer 54 is formed on the interconnect layer 11A, the insulating layer 12A, and the solder resist layer 13 by electroless plating. The plating seed layer 54 is a copper layer, for example. A thicknesses of the plating seed layer 54 is in a range of 100 nm to 1000 nm, for example.

Thereafter, as illustrated in FIG. 7B, a plating layer is formed by electrolytic plating using the plating seed layer 54 as a power feeding path, and the second layer 52 including the plating seed layer 54 is formed. In this case, similar to the first embodiment, the second layer 52 is formed so that the upper surface of the second layer 52 is located at a position higher than the upper surface of the solder resist layer 13.

Next, as illustrated in FIG. 7C, similar to the first embodiment, CMP and subsequent processes are performed on the second layer 52, the first layer 51, and the solder resist layer 13, and the surface layer portion of the second layer 52 is etched, so that the upper surface of the second layer 52 is located at a position below the upper surface of the solder resist layer 13. The connection terminal 30 is formed in this manner. After the etching the surface layer portion of the second layer 52, a surface treatment may be performed on the upper surface of the connection terminal 30 by electroless plating.

Next, similar to the first embodiment, the solder bump 14 is formed on the connection terminal 30 (refer to FIG. 6).

The wiring board 2 according to the second embodiment can be manufactured in the manner described above.

In the wiring board 2, similar to the first embodiment, it is possible to reduce the conduction failure and the short circuit between the connection terminals 30, and to reduce deterioration of the connection reliability.

Although the first layer 51 is not formed, the pad region 32 has the surface 35 making contact with the bottom surface 43 of the third opening 23, and a portion of the solder resist layer 13 is present between the pad region 32 and the insulating layer 12A, similar to the first embodiment. For this reason, even if a plating solution for the surface treatment were to enter between the side surface 41 and the inner wall surface 42, the plating solution would unlikely reach between the solder resist layer 13 and the insulating layer 12A. Accordingly, it is possible to reduce the short circuiting and haloing caused by entering of the plating solution.

In addition, when forming the plating seed layer 54 (refer to FIG. 7A), the interface between the solder resist layer 13 and the insulating layer 12A is only exposed at a boundary between the first opening 21 and the second opening 22. Thus, by spraying the plating solution in a direction perpendicular to the upper surface of the solder resist layer 13, it becomes less likely for the plating solution to enter the interface between the solder resist layer 13 and the insulating layer 12A.

According to the disclosed technique, it is possible to reduce the deterioration of the connection reliability.

Various aspects of the subject-matter described herein may be set out non-exhaustively in the following numbered clauses:

1. A method for manufacturing a wiring board, comprising:
forming a first insulating layer on an interconnect layer;
forming a second insulating layer on the first insulating layer;
forming a first opening in the first insulating layer and reaching the interconnect layer, and forming a second opening and a third opening in the second insulating layer, the second opening having a lower end thereof connected to an upper end of the first opening, the third opening having a lower end thereof connected to an upper end of the second opening; and
forming a connection terminal inside the first opening, the second opening, and the third opening, the connection terminal making contact with an upper surface of the interconnect layer, wherein:
a diameter of the lower end of the second opening is equal to a diameter of the upper end of the first opening, and
a diameter of the lower end of the third opening is larger than a diameter of the upper end of the second opening.
2. The method for manufacturing the wiring board according to clause 1, wherein the first opening, the second opening, and the third opening are formed by irradiating laser light.
3. The method for manufacturing the wiring board according to clause 1 or 2, wherein the first opening, the second opening, and the third opening are formed simultaneously.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
an interconnect layer;
a first insulating layer provided on the interconnect layer;
a second insulating layer provided on the first insulating layer;
a first opening formed in the first insulating layer and reaching the interconnect layer;
a second opening formed in the second insulating layer, the second opening having a lower end thereof connected to an upper end of the first opening;
a third opening formed in the second insulating layer, the third opening having a lower end thereof connected to an upper end of the second opening; and
a connection terminal formed inside the first opening, the second opening, and the third opening, and making contact with an upper surface of the interconnect layer, wherein:
a diameter of the lower end of the second opening is equal to a diameter of the upper end of the first opening, and
a diameter of the lower end of the third opening is larger than a diameter of the upper end of the second opening.

2. The wiring board as claimed in claim 1, wherein a composition of the first insulating layer is different from a composition of the second insulating layer.

3. The wiring board as claimed in claim 1, wherein the second insulating layer is a solder resist layer.

4. The wiring board as claimed in claim 1, wherein the connection terminal includes:

a first layer in contact with the second insulating layer, the first insulating layer, and the interconnect layer; and a second layer provided on an inner side of the first layer, wherein:

an electrical resistivity of a material forming the second layer is lower than an electrical resistivity of a material forming the first layer, and an adhesion between the material forming the first layer and the second insulating layer is higher than an adhesion between the material forming the second layer and the second insulating layer.

5. The wiring board as claimed in claim 4, wherein:

the first layer includes titanium, and the second layer includes copper.

6. The wiring board as claimed in claim 1, wherein the connection terminal includes:

a via region inside the first opening and the second opening; and a pad region inside the third opening, wherein the pad region has a surface making contact with a bottom surface of the third opening.

7. The wiring board as claimed in claim 6, wherein a side surface of the pad region makes contact with an inner wall surface of the third opening.

\* \* \* \* \*